(12) United States Patent
Rasalingam et al.

(10) Patent No.: US 12,108,577 B2
(45) Date of Patent: Oct. 1, 2024

(54) SELF-ALIGNING HEAT FINS FOR THERMAL MANAGEMENT

(71) Applicant: Western Digital Technologies, Inc., San Jose, CA (US)

(72) Inventors: Uthayarajan A/L Rasalingam, Nibong Tebal (MY); Vijay A/L Mohanarao, Sungai Petani (MY)

(73) Assignee: Sandisk Technologies, Inc., Milpitas, CA (US)

( * ) Notice: Subject to any disclaimer, the term of this patent is extended or adjusted under 35 U.S.C. 154(b) by 232 days.

(21) Appl. No.: 17/743,184

(22) Filed: May 12, 2022

(65) Prior Publication Data

US 2023/0371209 A1 Nov. 16, 2023

(51) Int. Cl.
*H05K 7/20* (2006.01)

(52) U.S. Cl.
CPC .......... *H05K 7/20509* (2013.01); *H05K 7/20* (2013.01); *H05K 7/20009* (2013.01); *H05K 7/20418* (2013.01); *H05K 7/205* (2013.01)

(58) Field of Classification Search
CPC .. H05K 7/20; H05K 7/20509; H05K 7/20009; H05K 7/20418; H05K 7/205; H05K 7/20409; H05K 1/0203; H01L 23/00; H01L 23/3672
USPC ........................................... 361/274.2, 274.3
See application file for complete search history.

(56) References Cited

U.S. PATENT DOCUMENTS

| | | | |
|---|---|---|---|
| 7,120,020 B2 | 10/2006 | Carter et al. | |
| 7,222,423 B2 | 5/2007 | Ellsworth, Jr. et al. | |
| 9,507,391 B2 | 11/2016 | Busch et al. | |
| 9,841,793 B2 | 12/2017 | Kwon et al. | |
| 9,875,951 B2 | 1/2018 | Glover et al. | |
| 10,088,244 B2 | 10/2018 | Bodenweber et al. | |
| 2004/0114327 A1 | 6/2004 | Sri-Jayantha et al. | |
| 2007/0199677 A1 | 8/2007 | Hwang et al. | |
| 2017/0299281 A1* | 10/2017 | Bodenweber | H01L 23/3672 |
| 2018/0263106 A1* | 9/2018 | Feismann | H02K 7/14 |
| 2021/0190575 A1* | 6/2021 | Smirnov | G01F 25/15 |

FOREIGN PATENT DOCUMENTS

CN 105114887 A 12/2015

* cited by examiner

*Primary Examiner* — Danny Nguyen
(74) *Attorney, Agent, or Firm* — Michael Best & Friedrich LLP (57) ABSTRACT

A thermal dissipation device for use with electronic assemblies or devices and that includes a heat conductive plate configured to thermally couple to one or more packaged components on a first side of the heat conductive plate. The thermal dissipation device further includes a heat conductive post coupled to a second side of the heat conductive plate. The heat conductive post includes a fin member rotatably coupled to the heat conductive post, which is configured to rotate about an axis of the heat conductive post to maximize both a flow of air across the fin member and thermal dissipation of heat from the heat conductive plate into the atmosphere.

19 Claims, 8 Drawing Sheets

SELF-ALIGNING HEAT FINS FOR THERMAL MANAGEMENT

BACKGROUND

This application relates generally to thermal dissipation devices, and more specifically, to an electronic device having heat dissipating components capable of increasing heat transfer by aligning with a flow of air.

Electronic devices, such as solid-state memory devices ("SSDs") generally utilize fixed heat sinks for dissipating heat generated by operation of the SSD. While these heat sinks are effective at removing heat from the SSD, their efficiency is often limited by a direction of airflow across one or more fins of the heat sink. Specifically, heat sinks are generally designed such that their heat transfer efficiency is increased based on an airflow across the heat sink in a known direction (e.g., wherein airflow is over the largest surface area of the heat sink). However, in system type environments (e.g., server systems), devices, such as SSDs may be placed in multiple positions and orientations within the system. Furthermore, the airflow may be generated at a system level and not specific to each device, resulting in the airflow across the heat sink potentially being directed in a non-optimal manner, thereby reducing the efficiency of the heat sink.

SUMMARY

Complex or large-scale memory and/or server systems may have many electronic devices, such as SSDs. However, managing airflow across all of the devices can prove difficult, and may result in reduced thermal efficiency of the devices. By providing self-aligning heat dissipating devices that align with airflow to improve cooling, increased component density and thermal efficiency may be achieved.

In one embodiment, a thermal dissipation device is described having a heat conductive plate configured to thermally couple to one or more packaged components on a first side of the thermally conductive plate. The thermal dissipation device further includes a heat conductive post coupled to a second side of the heat conductive plate. The heat conductive post includes a fin member rotatably coupled to the heat conductive post. The fin member is configured to rotate about an axis of the heat conductive post to maximize a flow of air across the heat conductive fin member and maximize thermal dissipation of heat from the heat conductive plate into the atmosphere.

In another embodiment a data storage device is described. The data storage device includes an enclosure and a substrate at least partially disposed within the enclosure, wherein the substrate includes one or more packaged components. The data storage device also includes a thermally conductive plate thermally coupled to at least one of the one or more packaged components on a first side of the thermally conductive plate, and a number of heat conductive posts coupled to a second side of the heat conductive plate. The heat conductive posts include a first fin member rotatably coupled to each of the plurality of heat conductive posts through an aperture of the first fin member. The first fin member is configured to rotate about a longitudinal axis of the heat conductive post to maximize airflow across the fin member. The heat conductive posts further include a first tapered portion configured to interface with the aperture of the first fin member.

In another embodiment, an electronic assembly is described. The electronic assembly includes a printed circuit board including one or more packaged components on a first side of the printed circuit board. The electronic assembly further includes a heat conductive plate thermally coupled to at least one of the one or more packaged components on a first side of the thermally conductive plate and a heat conductive post coupled to a second side of the heat conductive plate. The heat conductive post includes a first fin member rotatably coupled to the heat conductive post and a second fin member rotatably coupled to the heat conductive post. The first fin member and the second fin member are configured to rotate about a longitudinal axis of the heat conductive post to maximize airflow across the first fin member and the second fin member.

Various aspects of the present disclosure provide for improvements in memory devices. For example, increasing component density while maintaining or reducing current packaging dimensions allows for greater performance in smaller packages. The present disclosure can be embodied in various forms. The foregoing summary is intended solely to give a general idea of various aspects of the present disclosure and does not limit the scope of the present disclosure in any way.

DETAILED DESCRIPTION

In the following description, numerous details are set forth, such as data storage device configurations, and the like, in order to provide an understanding of one or more aspects of the present disclosure. It will be readily apparent to one skilled in the art that these specific details are merely exemplary and not intended to limit the scope of this application. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, etc. Those of skill in the art also will realize that although the disclosure refers to a substrate used in a data storage device, the disclosure may apply to substrates used in other types of electronic devices. The disclosure applies to both substrates and printed circuit boards used in electronic devices. Further, although specific examples disclose memory devices, it will be understood by those of skill in the art that the inventive concepts disclosed herein may be applied to other types of electronic devices that are assembled using a printed circuit board.

Figure 1:
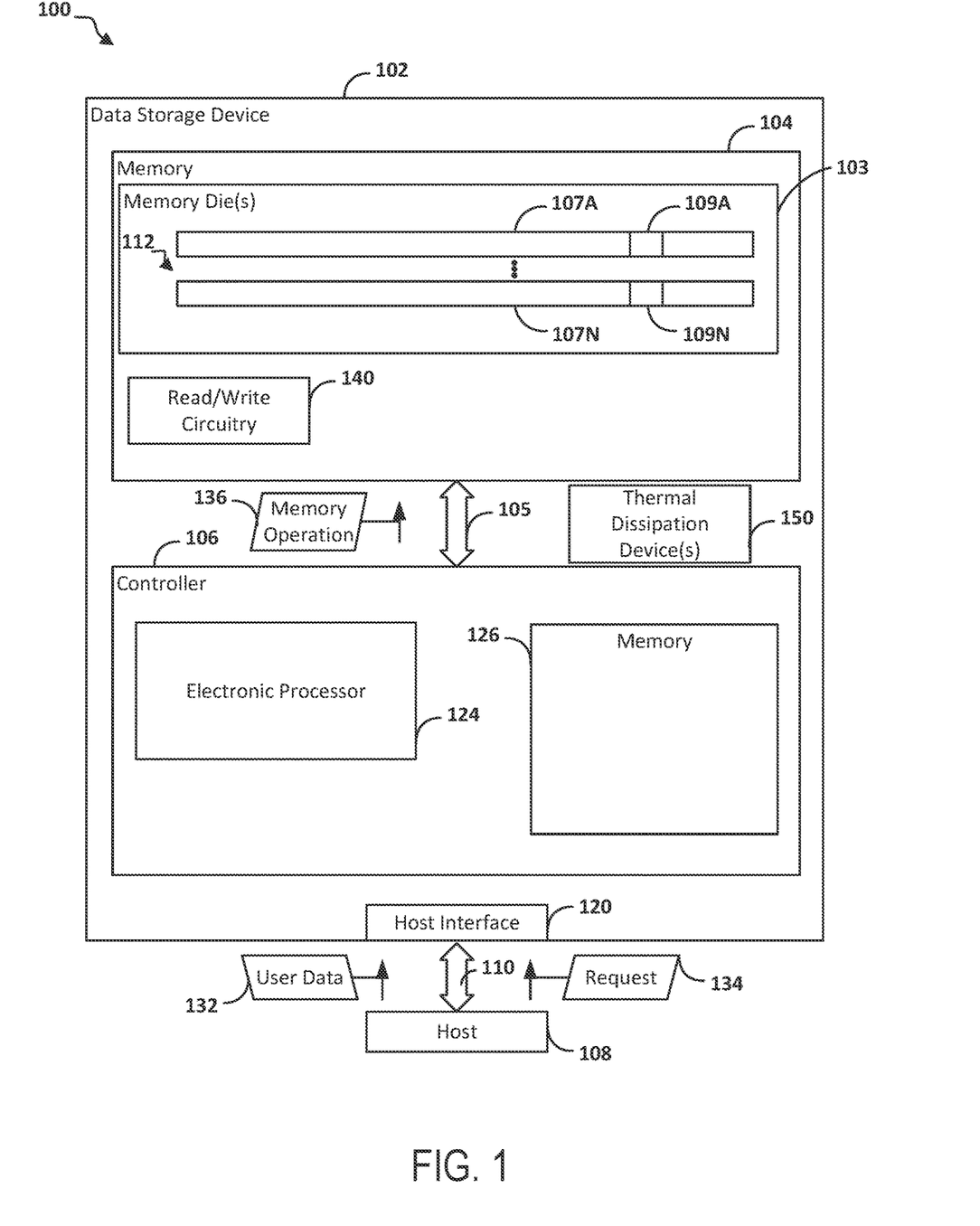
FIG. 1 is block diagram of one example of a system including a data storage device, according to some embodiments.

FIG. 1 is a block diagram of one example of a system 100 that includes a data storage device 102 in communication with a host device 108. The data storage device 102 includes a memory device 104 (e.g., non-volatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled with a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to an SSD, which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 108 with the communication path 110, such as a wired communication path and/or a wireless communication path. For example, the data storage device 102 may include an interface 120 (e.g., a host interface) that enables communication with the communication path 110 between the data storage device 102 and the host device 108, such as when the interface 120 is communicatively coupled to the host device 108. In some embodiments, the communication path 110 may include one or more electrical signal contact pads or fingers that provide electrical communication between the data storage device 102 and the host device 108.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide data, such as user data 132, to be stored at the memory device 104 or to request data 134 to be read from the memory device 104. The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates with a memory interface that enables reading from the memory device 104 and writing to the memory device 104. In some examples, the host device 108 may operate in compliance with an industry specification, such as a Universal Flash Storage (UFS) Host Controller Interface specification. In other examples, the host device 108 may operate in compliance with one or more other specifications, such as a Secure Digital (SD) Host Controller specification or other suitable industry specification. The host device 108 may also communicate with the memory device 104 in accordance with any other suitable communication protocol.

The memory device 104 of the data storage device 102 may include a non-volatile memory (e.g., NAND, BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies 103. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements (e.g., memory cells that are referred to herein as a "string"), such as a representative storage elements 109A and 109N, respectively.

The memory device 104 may include support circuitry, such as read/write circuitry 140 to support operation of the one or more memory dies 103. Although depicted as a single component, the read/write circuitry 140 may be divided into separate components of the memory device 104, such as read circuitry and write circuitry. The read/write circuitry 140 may be external to the one or more memory dies 103 of the memory devices 104. Alternatively, one or more individual memory dies may include corresponding read/write circuitry that is operable to read from and/or write to storage elements within the individual memory die independent of any other read and/or write operations at any of the other memory dies.

The controller 106 is coupled to the memory device 104 (e.g., the one or more memory dies 103) with a bus 105, an interface (e.g., interface circuitry), another structure, or a combination thereof. For example, the bus 105 may include multiple distinct channels to enable the controller 106 to communicate with each of the one or more memory dies 103 in parallel with, and independently of, communication with the other memory dies 103.

The controller 106 is configured to receive data and instructions from the host device 108 and to send data to the host device 108. For example, the controller 106 may send data to the host device 108 using the interface 120, and the controller 106 may receive data from the host device 108 with the interface 120. The controller 106 is configured to send data and commands (e.g., the memory operation 136, which may be a cycle operation of a memory block of the memory device 104) to the memory device 104 and to receive data from the memory device 104. For example, the controller 106 is configured to send data and a program or write command to cause the memory device 104 to store data to a specified address of the memory device 104. The write command may specify a physical address of a portion of the memory device 104 (e.g., a physical address of a word line of the memory device 104) that is to store the data.

The controller 106 is configured to send a read command to the memory device 104 to access data from a specified address of the memory device 104. The read command may specify the physical address of a region of the memory device 104 (e.g., a physical address of a word line of the memory device 104). The controller 106 may also be configured to send data and commands to the memory device 104 associated with background scanning operations, garbage collection operations, and/or wear-leveling operations, or other suitable memory operations.

The controller 106 may include a processor 124, a memory 126, and other associated circuitry. The memory 126 may be configured to store data and/or instructions that may be executable by the processor 124.

The controller 106 may send the memory operation 136 (e.g., a read command) to the memory device 104 to cause the read/write circuitry 140 to sense data stored in a storage element. For example, the controller 106 may send the read command to the memory device 104 in response to receiving a request for read access from the host device 108. In response to receiving the read command, the memory device 104 may sense the storage element 107A (e.g., using the read/write circuitry 140) to generate one or more sets of bits representing the stored data.

The data storage device 102 may further include one or more heat dissipation devices 150. The one or more heat dissipation devices 150 may include passive heat dissipation devices, such as heat sinks and/or active heat dissipation devices such as forced air devices or liquid cooling systems. Specific heat dissipation devices are described with more detail below.

Generally, one or more components of the data storage device 102, such as the memory devices 104 and/or the controller 106 are solid-state integrated circuit packages. These packages are coupled to a printed circuit board ("PCB") or other applicable substrates. Often a grid array component is used to maximize the connection points between the package and the substrate.

Figure 2:
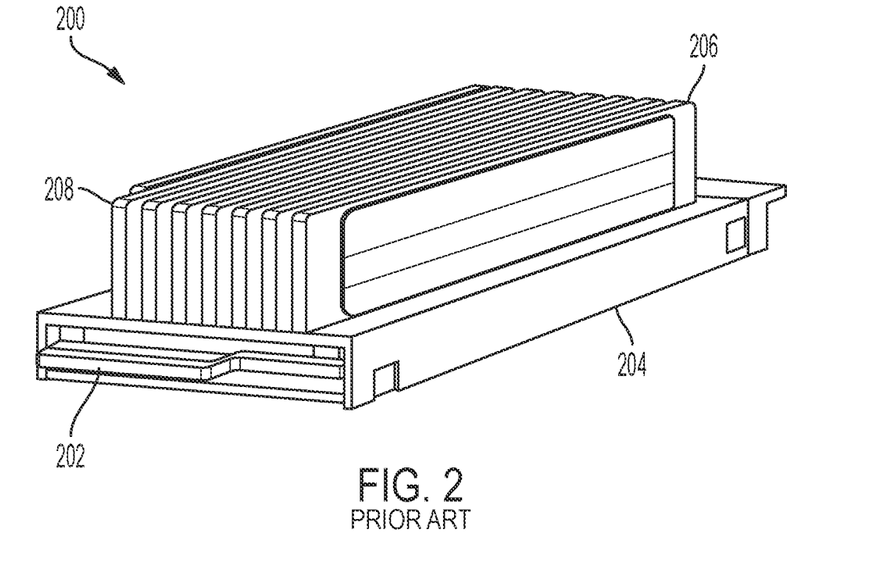
FIG. 2 is a perspective view of an electronic device with a heat sink, according to some embodiments.

Turning now to FIG. 2, a perspective view of a general data storage device 200, such as an SSD is shown, according to some embodiments. As shown in FIG. 2, the data storage device 200 may include a PCB 202 positioned within an enclosure 204. The PCB 202 may include various components of the data storage device 200, such as those described above with respect to FIG. 1. For example, the PCB 202 may include components such as a controller and one or more memory devices, such as controller 106 and memory devices 104, described above. In some examples, the enclosure is constructed using a metal material, such as aluminum or steel. However, in other examples, the enclosure 204 may be constructed of a non-metallic material, such as polymer, plastic, or other material as required for a given application. The data storage device 200 may further include a heat sink 206. The heat sink 206 may be attached to or integrated with the enclosure 204. The heat sink 206, either directly or through the enclosure 204, may be in physical contact with one or more components coupled to the PCB 202 to allow for the heat sink to allow for transfer of heat generated by the one or more components into the ambient air.

Figure 3:
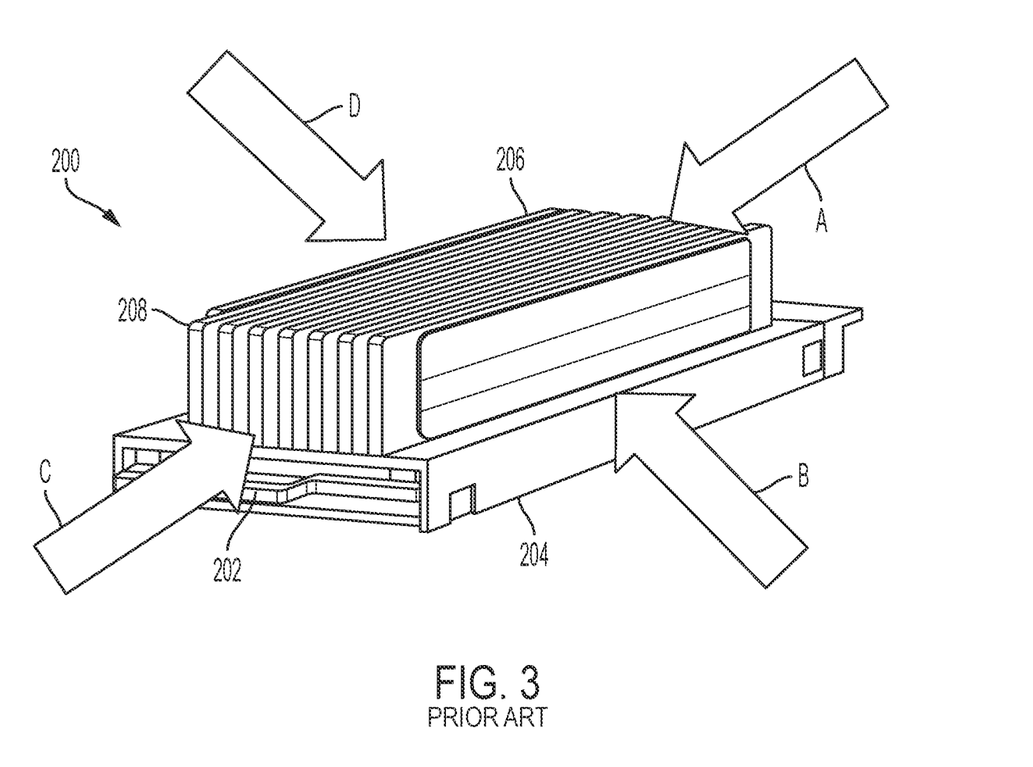
FIG. 3 is a perspective view of the electronic device of FIG. 2 with various airflows, according to some embodiments.

As shown in FIG. 2, the heat sink 206 includes a series of metallic members, such as plates or fins 208, which are used to maximize the surface area of the heat sink 206 to allow for maximum heat transfer from the heat sink 206 to the ambient air. In order to increase the heat transfer from the heat sink 206 to the ambient air, an airflow may be applied to the data storage device 200, and thereby to the heat sink 206. The airflow may be a natural airflow, or may be generated using air moving equipment, such as a fan, a blower, or other forced-air equipment. Turning now to FIG. 3, the data storage device 200 of FIG. 2 is shown with various airflows, A, B, C, D being applied. As shown in FIG. 3, airflows in direction A and C provide optimal cooling, as the air may pass between the fins 208, thereby flowing across the largest possible surface area of the heat sink 206. In contrast, air flows B and D interact with the heat sink in a generally perpendicular orientation relative to the direction of the fins 208. This results in the airflow generally only being applied to a single fin 208, or more so to only a single face of a single fin 208. This reduces the efficiency of the heat sink 206, as the airflow does not contact a substantial portion of the surface area of the heat sink 206. This may be the result of varying airflows within a system, a positioning of one or more data storage devices or other components within the system, etc.

Turning now to FIGS. 4-10, a data storage device 300 having a self-aligning heat sink is shown, according to some embodiments. Similar to the data storage device 200 described above, the data storage device 300 include a PCB 302 positioned within an enclosure 304. The PCB 302 may include multiple components 306, 308 coupled to the PCB 302. The components 306, 308 may be various components associated with the data storage device 300, including a controller and/or one or more memory devices, such as the controller 106 and/or memory device 104 described above.

As shown in FIGS. 4-10, the data storage device 300 further includes a heat conductive plate 310. The heat conductive plate 310 may be coupled to one or more components, such as components 306, 308 on a first side 311 of the heat conductive plate 310. In one embodiment, a heat conduction material 313 may be placed between the heat conductive plate 310 and the one or more components 306, 308. In one embodiment, the heat conductive material 313 is non-electrically conductive. For example, the heat conductive material 313 may be a thermal paste, thermal adhesive, thermally conductive sheets or tape (e.g., silicone), or other material configured to maximize heat transfer between the components 306, 308 and the heat conductive plate 310. In one embodiment, the heat conductive plate 310 is made of a metallic material, such as copper. However, other metallic materials, such as steel, aluminum, or other metallic material as appropriate for a given application.

As further shown in FIGS. 4-10, one or more heat conductive posts 314 may be coupled to a second side 312 of the heat conductive plate 310. The heat conductive posts 314 may be made of the same material as the heat conductive plate 310, such as copper. However, in other embodiments, the heat conductive posts 314 may be made of a different material than the heat conductive plate 310. In one embodiment, the heat conductive posts 314 are integrally formed with the heat conductive plate 310. In other embodiments, the heat conductive posts 314 are coupled to the heat conductive plate 310 using other attachment mechanisms, such as a welded attachment, a threaded attachment, a soldered attachment, a press fit attachment or other attachment mechanism sufficient to effectively transfer heat from heat conductive plate 310 to the heat conductive posts 314.

In one embodiment, the heat conductive posts 314 include a first tapered portion 316, a second tapered portion 318, and an end portion 320. The first tapered portion 316, the second tapered portion 318, and the end portion 320 may be integrally formed within the heat conductive post 314. In other examples, the heat conductive posts 314 may have a multi-piece construction. For example, the end portion 320 may be removably coupled to the heat conductive post 314. For example, the end portion 320 may couple to a first end 322 using a threaded connection. However, other connections, such as a press-fit connection, are also contemplated. In still other examples, the heat conductive posts 314 may be formed in two-pieces and may be configured to be separated at the second tapered portion 318, such as using a threaded connection.

Figure 11:
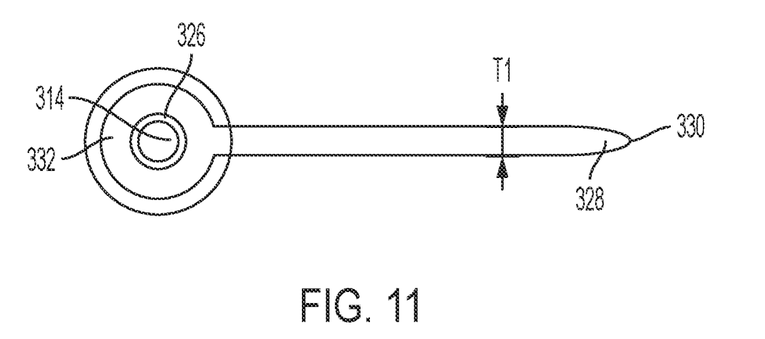
FIG. 11 is a top view of a heat conductive pin coupled to a heat conductive post, according to some embodiments.
Figure 12:
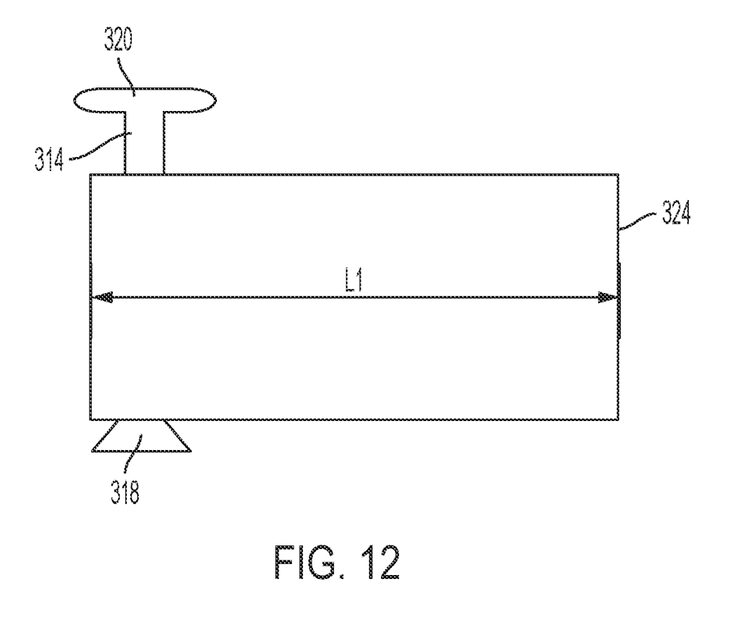
FIG. 12 is a side view of the heat conductive pin and the heat conductive post of FIG. 11, according to some embodiments.

Each heat conductive post 314 may include one or more heat conductive fins 324. The heat conductive fins 324 may be rotatably coupled to the heat conductive posts 314. The heat conductive fins 324 are positioned along a longitudinal axis of the heat conductive posts 314. Turning now to FIGS. 11-12, the interface between the heat conductive fins 324 and the heat conductive post are shown in greater detail. FIG. 11 is a top-down view of a heat conductive fin 324 coupled to a heat conductive post 314. As shown in FIG. 11, the heat conductive post 314 extend through an aperture 326 of the heat conductive fin 324. The interface between the heat conductive post 314 and the aperture 326 is configured to allow for the heat conductive fin 324 to rotate freely about a longitudinal axis of the heat conductive post 314. By rotating freely, the heat conductive fin 324 may rotate to align with a direction of airflow, thereby maximizing thermal efficiency, as will be described in more detail below.

As shown in FIG. 11, the heat conductive fin 324 includes a tapered portion 328 at a first end 330, which is opposite a second end 332 closest to the aperture 326. The tapered portion 328 may be configured to increase air flow over the heat conductive fin 324. The tapered portion 328 may also be configured to ensure maximum alignment with the airflow by stabilizing the heat conductive fins 324. In some examples, the heat conductive fin 324 may not include the tapered end portion 328. The heat conductive fin 324 may have a thickness T1 of approximately 1 mm. However, thickness values of more than 1 mm or less than 1 mm are also contemplated as appropriate for a given application.

FIG. 12 is a side view of the heat conductive fin 324 coupled to the heat conductive post 314 shown in FIG. 11. As shown in FIG. 12, the second tapered portion 318 of the heat conductive post 314 is shown interfacing with the heat conductive fin 324. In one embodiment, the second tapered portion 318 is configured to interface with the aperture 326 to maximize contact between the second tapered portion 318 and the heat conductive fin 324 to increase heat transfer between the heat conductive post 314 and the heat conductive fin. In some examples, a recessed portion 334 (FIG. 13) of the heat conductive fin 324 around the aperture 326 may be chamfered or counter-sunk to allow for a more complementary fit between the first tapered portion 316 and/or second tapered portion 318 and the heat conductive fin 324. The recessed portion 334 may be located at both ends of the aperture 326 of the heat conductive posts 314. In one embodiment, the recessed portion 334 is shaped to correspond to the complementary shape of the first tapered portions 316 and/or the second tapered portion 318 of the heat conductive post 314. As shown in FIG. 12, the end portion 320 is configured to prevent the heat conductive fin 324 from being removed from the heat conductive post 314.

The heat conductive fin 324 may have a length L1 of about 10 cm. However, lengths of more than 10 cm or less than 10 cm are also contemplated as required for a given application. While FIGS. 11-12 show only a single heat conductive fin 324 coupled to the heat conductive post 314, two (or more) heat conductive fins 324 may be coupled to a single conductive post 314, as shown in FIGS. 4-7 and 11. The heat conductive fin 324 may have a height H1 of about 10 cm. However, heights of more than 10 cm or less than 10 cm are also contemplated as required for a given application. In some examples, the length L1 and/or height H1 of the heat conductive fins 324 may be based on a size of the data storage device 102. For example, the length L1 may be based on a number of heat conductive fins 324 and a required clearance distance between respective heat conductive fins 324. Example clearance distances may be 0.5 mm. However, values of more than 0.5 mm or less than 0.5 mm are also contemplated as required for a given application.

Returning now to FIG. 4, the data storage device 300 may further include a frame 336. The frame 336 may generally be an open frame, as shown in greater detail in FIG. 10. The frame 336 is generally configured to allow airflow through the frame 336, while offering protection to the heat conductive posts 314 and heat conductive fins 324. For example, when installing, maintaining, or otherwise moving the data storage device 300, the heat conductive posts 314 and/or heat conductive fins 324 may become damaged by coming into contact with one or more other objects. The frame 336 provides a protective area for the conductive posts 314 and the conductive fins 324 to reduce the risk of damage from contact with other objects. In one embodiment, the frame 336 may be constructed of a metallic material, such as aluminum or steel. However, other metallic materials are also contemplated as required for a given application. In other embodiments, the frame 336 may be constructed of a non-metallic material such as plastic, polymer, or other non-metallic material as appropriate for a given application. While not shown, it is contemplated that the frame 336 may be surrounded by a material to prevent or reduce the opportunity for foreign objects to be passed across the heat conductive fins 324. For example, the frame may be surrounded by corrugated plastic or metal, a mesh screen, or other material that minimizes the restriction of airflow through the frame.

Figure 13:
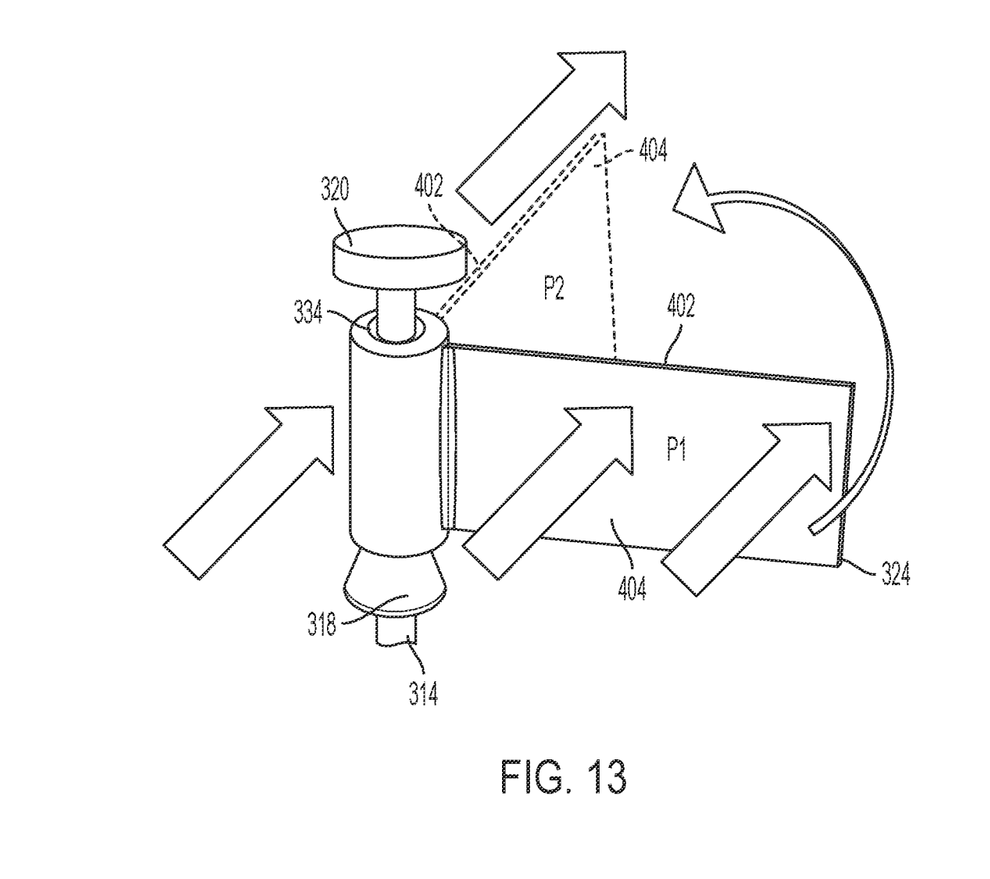
FIG. 13 is a perspective view of the heat conductive pin and the heat conductive post of FIG. 11 moving between a first and second position, according to some embodiments.

As noted above, the heat conductive fins 324 are configured to rotate based on an airflow across the heat conductive fins 324. This is shown in FIG. 13, which shows a heat conductive fin 324 in a first position P1. An airflow 400 is applied to the heat conductive fin P1, thereby causing the heat conductive fin 324 to move into position P2 by rotating about the heat conductive post 314. In position P2, the airflow 400 passes air along a first face 402 and a second face 404 of the heat conductive fin 324, thereby increasing heat transfer to the air/atmosphere from the heat conductive fin 324.

Figure 4:
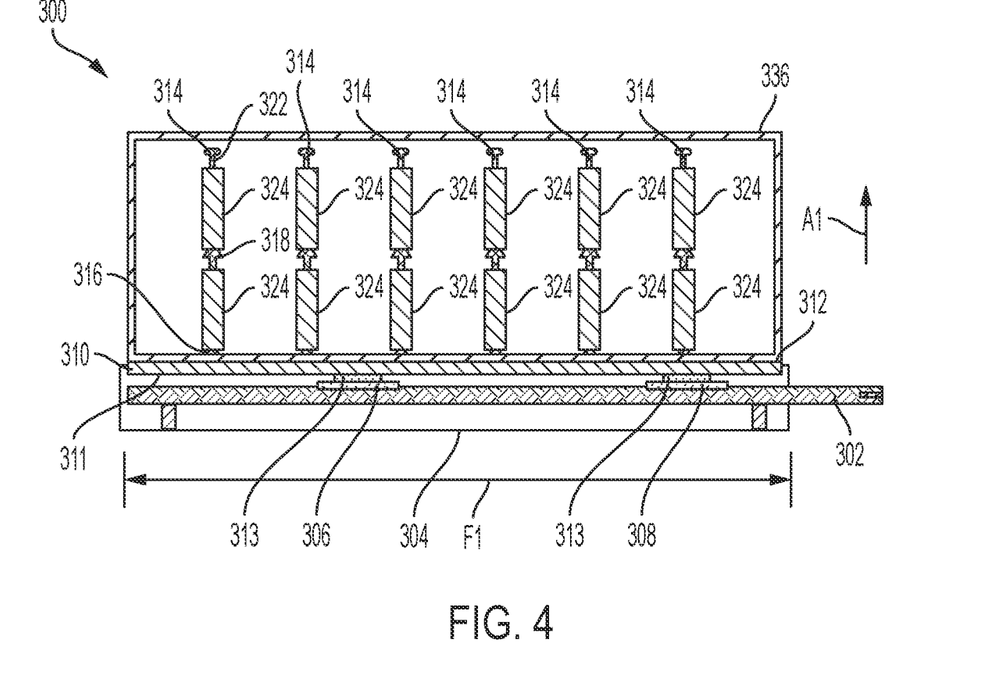
FIG. 4 is a side cross-sectional view of a data storage device with a plurality of self-aligning heat fins with airflow in a first direction, according to some embodiments.
Figure 5:
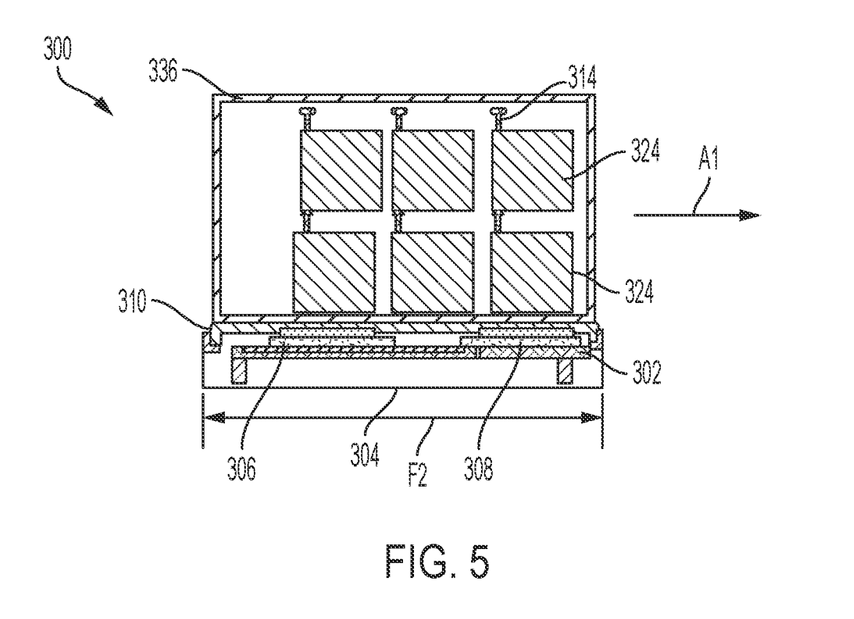
FIG. 5 is an end cross-sectional view of the data storage device of FIG. 4, according to some embodiments.

FIGS. 4, 5, 8, and 10 illustrate the data storage device 300 having an airflow flowing in a direction A1 across the data storage device 300. FIG. 4 is a side view of the data storage device 300 along a long face F1 of the data storage device 300. The airflow in direction A1 is generally perpendicular to the long face F1 of the data storage device 300, thereby causing the heat conductive fins 324 to rotate perpendicular to the long face F1, in the direction of the airflow in direction A1. This is further shown in FIG. 5, which is a side view of the data storage device along a short face F2, which is generally perpendicular to the long face F1. As shown in FIG. 5, the airflow in direction A1 results in the heat conductive fins 324 rotating about the heat conductive posts 314 in the direction of the airflow A1, which is generally parallel to the short face F2.

Figure 8:
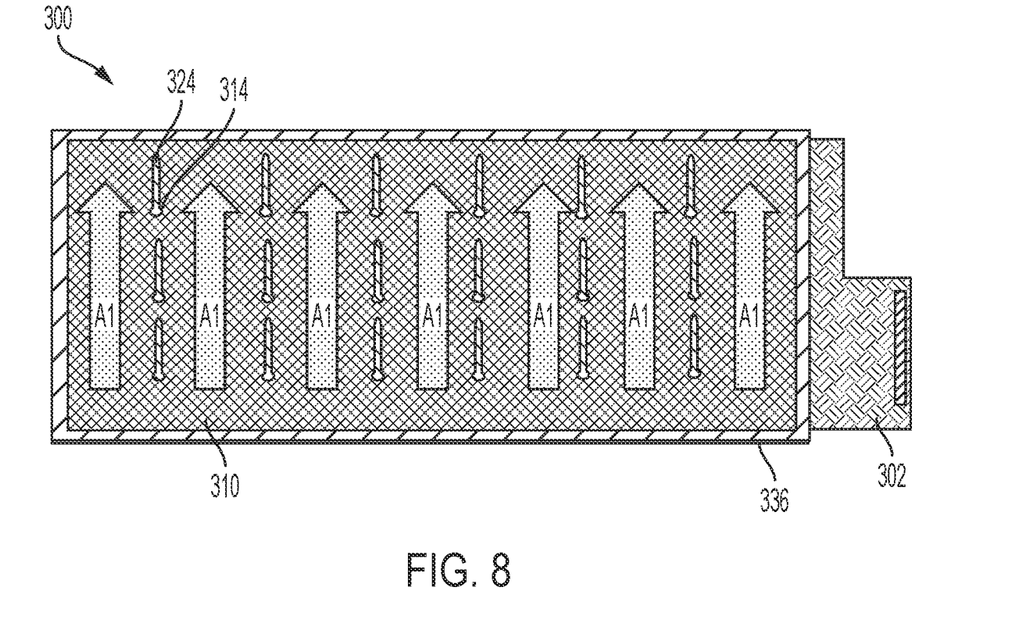
FIG. 8 is a top view of the data storage device of FIG. 4 with the airflow in the first direction, according to some embodiments.

FIG. 8 shows a top view of the data storage device with the airflow in direction A1 causing the heat conductive fins 324 to position themselves in the direction of the airflow A1. As shown in FIG. 8, this allows the airflow to pass along both sides of the heat conductive fins 324, thereby maximizing heat transfer between the heat conductive fins 324 and the air/atmosphere by maximizing the surface area of the heat conductive fins 324 in the path of the airflow. FIG. 11 is a perspective view of the data storage device 300 where the airflow in in direction A1.

Figure 6:
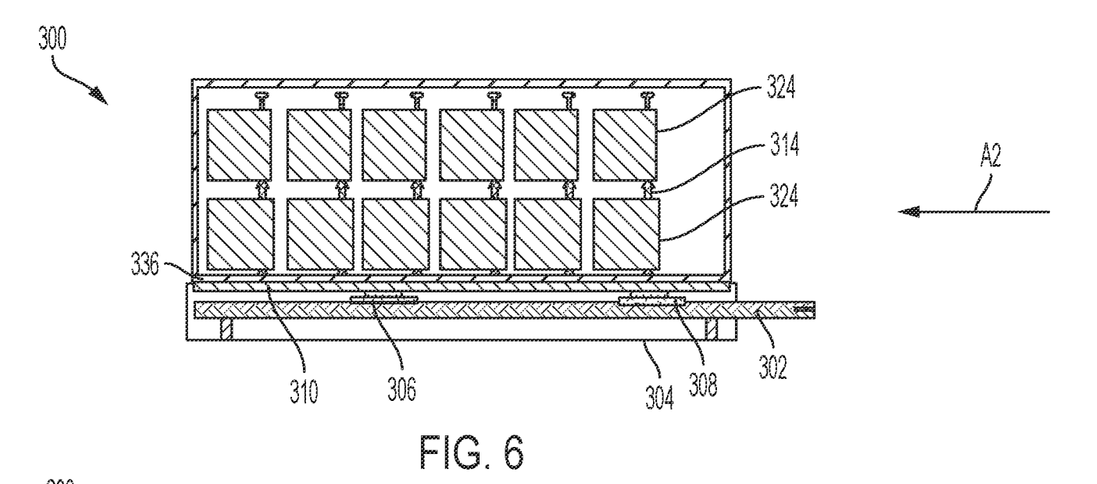
FIG. 6 is a side cross-sectional view of the data storage device of FIG. 4 with airflow in a second direction, according to some embodiments.
Figure 7:
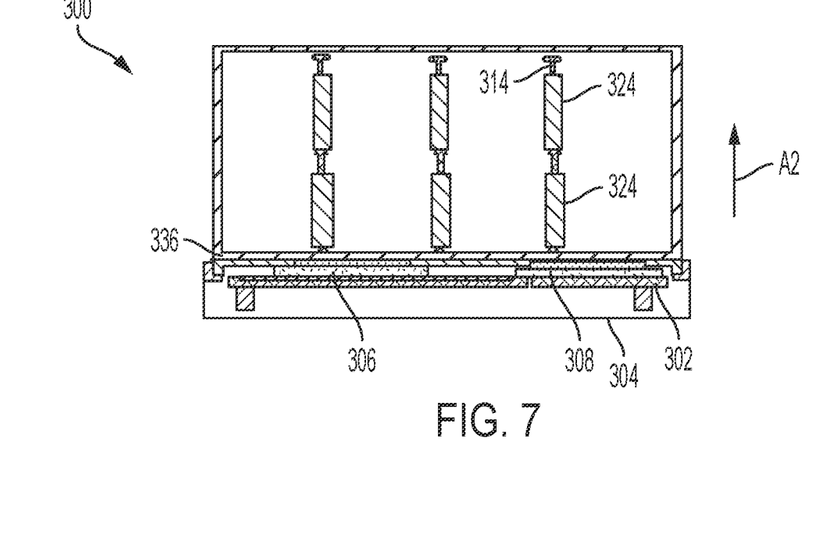
FIG. 7 is an end cross-sectional view of the data storage device of FIG. 4 with airflow in a second direction, according to some embodiments.
Figure 9:
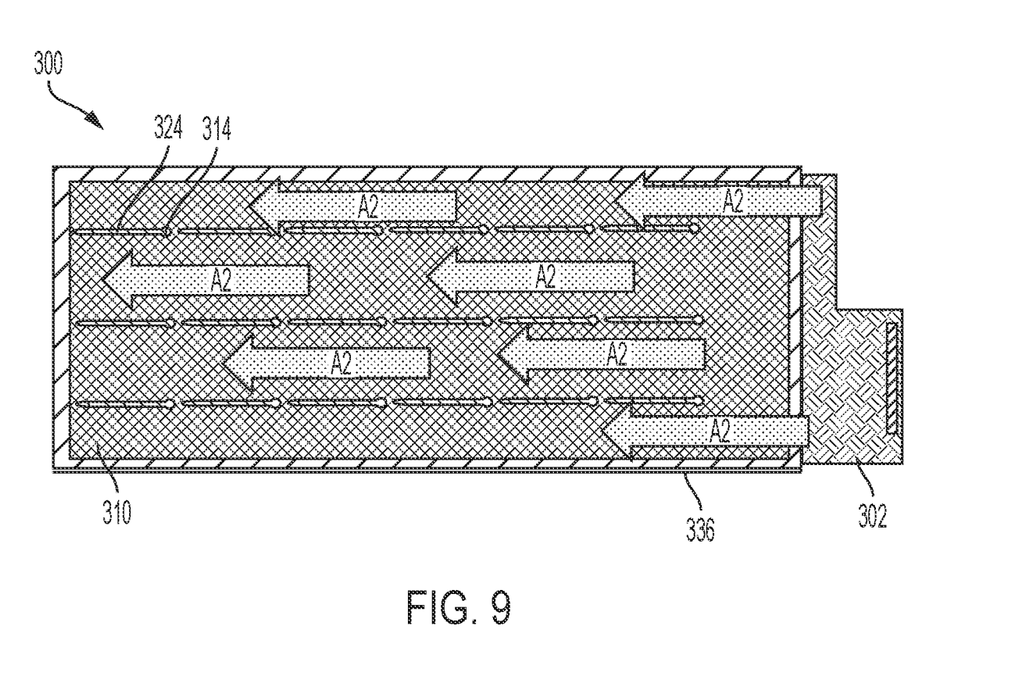
FIG. 9 is a top view of the data storage device of FIG. 4, with the airflow in the second direction, according to some embodiments.
Figure 10:
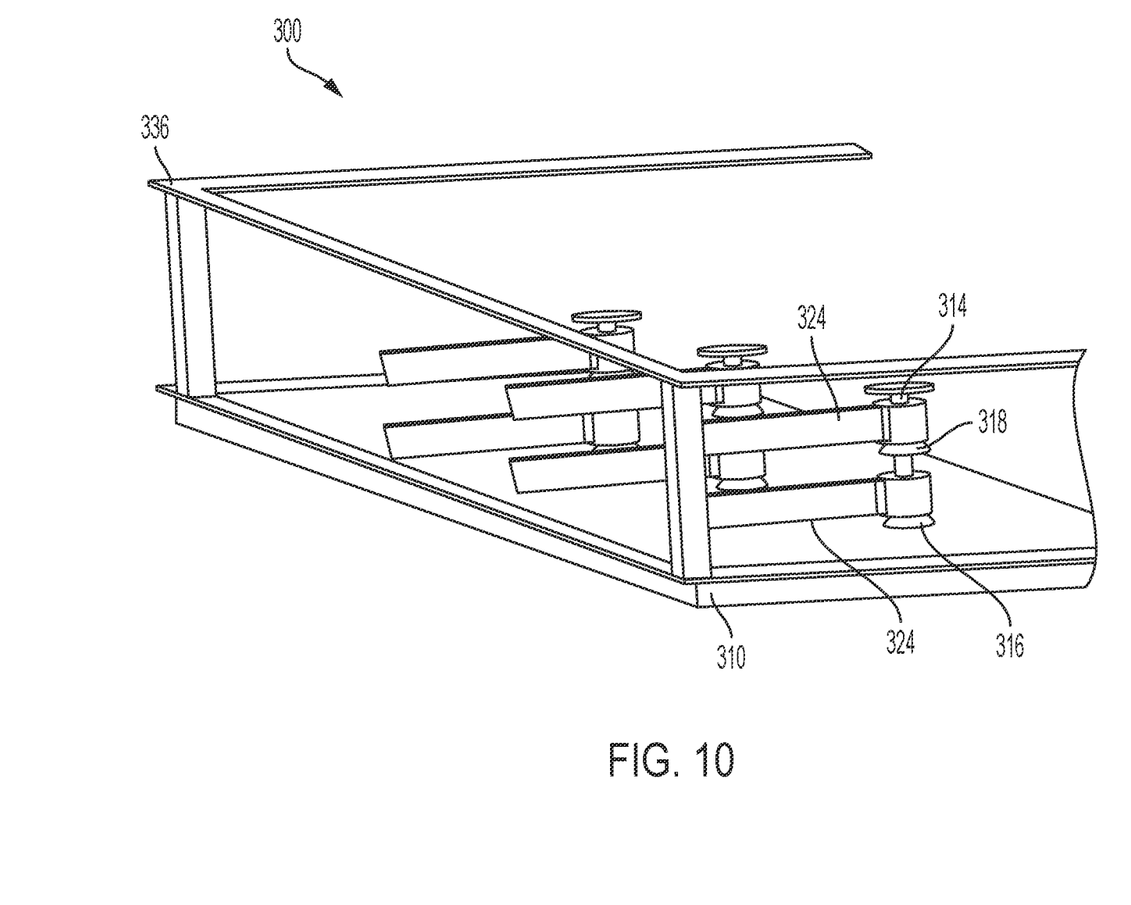
FIG. 10 is a partial perspective view of the data storage device of FIG. 4, according to some embodiments.

FIGS. 6, 7, and 9 illustrate the data storage device 300 where the airflow is in direction A2 across the data storage device 300. FIG. 6 is a side view of the data storage device 300 along the long face F1 of the data storage device 300. The airflow in direction A2 is generally parallel to the long face F1 of the data storage device 300, thereby causing the heat conductive fins 324 to rotate to orient themselves parallel to the long face F1, in the direction of the airflow in direction A2. This is further shown in FIG. 7, which is a side view of the data storage device 300 along the short face F2, which is generally perpendicular to the long face F1. As shown in FIG. 7, the airflow in direction A2 results in the heat conductive fins 324 rotating about the heat conductive posts 314 in the direction of the airflow A2, which is generally perpendicular to the short face F2.

FIG. 9 shows a top view of the data storage device with the airflow in direction A2 causing the heat conductive fins 324 to position themselves in the direction of the airflow A2. As shown in FIG. 9, this allows the airflow to pass along both sides of the heat conductive fins 324, thereby maximizing heat transfer between the heat conductive fins 324 and the air/atmosphere by maximizing the surface area of the heat conductive fins 324 in the path of the airflow.

The above embodiments are meant to be exemplary in nature, and it is understood that airflow in directions other than A1 or A2 will result in the heat conductive fins 324 rotating about the heat conductive posts 314 in the direction of the airflow at any given time from any given direction. This allows for maximum airflow across all or most of the heat conducting fins 324 resulting in maximum thermal efficiency for the associated data storage device 300.

FIGS. 4-11 generally illustrate a data storage device 300 having three rows of six heat conductive posts 314 with each heat conductive post 314 having two vertically arranged heat conducting fins 324. However, other configurations are contemplated such as single stacked heat conductive fins 324, more heat conductive posts 314, fewer heat conductive posts 314, and the like. It is contemplated that various arrangements of heat conductive posts 314 and/or heat conductive fins 324 may be used for different data storage devices 300. Multiple arrangements may be used provided there is sufficient clearance between the heat conductive fins 324 to avoid interference or contact between each heat conductive fin 324. Furthermore, while the embodiments are described with respect to a data storage device, it is understood that the above embodiments may be applied to various electronic devices requiring heat dissipation.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A thermal dissipation device, comprising:
   an enclosure;
   a heat conductive plate attached to a surface of the enclosure and configured to thermally couple to one or more packaged components on a first side of the heat conductive plate; and
   a heat conductive post coupled to a second side of the heat conductive plate and extending through the surface of and into the enclosure, wherein the heat conductive post includes:
   a fin member rotatably coupled to the heat conductive post, wherein the fin member is configured to rotate about an axis of the heat conductive post to maximize a flow of air across the fin member and increase thermal dissipation of heat from the heat conductive plate into the atmosphere.

2. The thermal dissipation device of claim 1, wherein the fin member is coupled to the heat conductive post through an aperture of the fin member.

3. The thermal dissipation device of claim 2, wherein the heat conductive post includes a tapered portion configured to interface with the aperture of the fin member.

4. The thermal dissipation device of claim 3, wherein the fin member further includes a recessed portion surrounding a portion of the aperture, wherein the recessed portion is configured to receive the tapered portion of the heat conductive post.

5. The thermal dissipation device of claim 1, wherein the heat conductive post is welded to the heat conductive plate.

6. The thermal dissipation device of claim 1, wherein the heat conductive plate is copper.

7. The thermal dissipation device of claim 1, wherein the heat conductive post and the fin member are copper.

8. A data storage device, comprising:
an enclosure;
a substrate at least partially disposed within the enclosure, wherein the substrate includes one or more packaged components;
a thermally conductive plate thermally coupled to at least one of the one or more packaged components on a first side of the thermally conductive plate; and
a plurality of heat conductive posts coupled to a second side of the heat conductive plate, wherein each of the plurality of heat conductive posts includes:
a first fin member rotatably coupled to a respective one of the plurality of heat conductive posts through an aperture of the first fin member, wherein the first fin member is configured to rotate about a longitudinal axis of the respective heat conductive post to increase airflow across at least one of the first fin member and the thermally conductive plate,
a first tapered portion configured to interface with the aperture of the first fin member; and
a frame coupled to the enclosure and configured to provide protection for the plurality of heat conductive posts while allowing unrestricted airflow through the frame.

9. The data storage device of claim 8, wherein the first fin member includes a recessed portion surrounding a portion of the aperture of the first fin member, the recessed portion is configured to interface with the first tapered portion of the heat conductive post.

10. The data storage device of claim 8, wherein each of the plurality of heat conductive posts further includes:
a second fin member rotatably coupled to a respective one of the plurality of heat conductive posts through an aperture of the second fin member, wherein the second fin member is configured to rotate about the longitudinal axis of the respective heat conductive post to increase airflow across the second fin member, and
a second tapered portion configured to interface with the aperture of the second fin member.

11. The data storage device of claim 10, wherein the second fin member includes a recessed portion surrounding a portion of the aperture of the second fin member, the recessed portion of the second fin member configured to interface with the second tapered portion of the heat conductive post.

12. The data storage device of claim 8, wherein the plurality of heat conductive posts are one of integrally formed with the heat conductive plate, welded to the heat conductive plate, or coupled to the heat conductive plate using a threaded connection.

13. The data storage device of claim 8, wherein the thermally conductive plate, the plurality of heat conductive posts, and the first fin members are copper.

14. An electronic assembly, comprising:
an enclosure;
a printed circuit board at least partially disposed within the enclosure, wherein the printed circuit board includes one or more packaged components on a first side of the printed circuit board;
a heat conductive plate thermally coupled to at least one of the one or more packaged components on a first side of the thermally conductive plate;
a heat conductive post coupled to a second side of the heat conductive plate, wherein the heat conductive post includes:
a first fin member rotatably coupled to the heat conductive post, and
a second fin member rotatably coupled to the heat conductive post,
wherein the first fin member and the second fin member are configured to rotate about a longitudinal axis of the heat conductive post to increase airflow across the first fin member and the second fin member; and
a frame coupled to the enclosure and configured to provide protection for the heat conductive post while allowing unrestricted airflow through the frame.

15. The electronic assembly of claim 14, wherein the heat conductive post is coupled to the first fin member and the second fin member through an aperture of the first fin member and an aperture of the second fin member.

16. The electronic assembly of claim 15, wherein the heat conductive post includes a first tapered portion and a second tapered portion, wherein the first tapered portion is configured to interface with the aperture of the first fin member, and the second tapered portion is configured to interface with the aperture of the second fin member.

17. The electronic assembly of claim 16, wherein the first fin member includes a recessed portion surrounding a portion of the aperture of the first fin member and the second fin member includes a recessed portion surrounding a portion of the aperture of the second fin member, wherein the recessed portion of the first fin member is configured to receive the first tapered portion of the heat conductive post and the recessed portion of the second fin member is configured to receive the second tapered portion of the heat conductive post.

18. The electronic assembly of claim 14, wherein the heat conductive post is a two-piece heat conductive post.

19. The electronic assembly of claim 14, wherein the heat conductive plate, the heat conductive post, the first fin member, and the second fin member are copper.

* * * * *